(12) United States Patent
Nakamura

(10) Patent No.: US 11,264,494 B2
(45) Date of Patent: Mar. 1, 2022

(54) WIDE-GAP SEMICONDUCTOR DEVICE

(71) Applicant: SHINDENGEN ELECTRIC MANUFACTURING CO., LTD., Tokyo (JP)

(72) Inventor: Shunichi Nakamura, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/763,542

(22) PCT Filed: Nov. 13, 2017

(86) PCT No.: PCT/JP2017/040676
§ 371 (c)(1),
(2) Date: May 12, 2020

(87) PCT Pub. No.: WO2019/092871
PCT Pub. Date: May 16, 2019

(65) Prior Publication Data
US 2020/0279946 A1    Sep. 3, 2020

(51) Int. Cl.
*H01L 29/41*    (2006.01)
*H01L 29/49*    (2006.01)
*H01L 29/66*    (2006.01)
*H01L 29/78*    (2006.01)
(Continued)

(52) U.S. Cl.
CPC ...... *H01L 29/7811* (2013.01); *H01L 29/1095* (2013.01); *H01L 29/1608* (2013.01);
(Continued)

(58) Field of Classification Search
CPC ....... H01L 29/40; H01L 29/402; H01L 29/42; H01L 29/417; H01L 29/41741;
(Continued)

(56) References Cited

U.S. PATENT DOCUMENTS

2004/0031971 A1    2/2004  Shimoida et al.
2013/0313635 A1*  11/2013  Nakano ............ H01L 29/66727
                                                                                        257/330
(Continued)

FOREIGN PATENT DOCUMENTS

JP    2003318413 A    11/2003
JP    2013120784 A    6/2013
(Continued)

OTHER PUBLICATIONS

International Search Report in the international application No. PCT/JP2017/040676, dated Jan. 23, 2016.
(Continued)

*Primary Examiner* — Fazli Erdem
(74) *Attorney, Agent, or Firm* — Ladas & Parry, LLP

(57) ABSTRACT

A wide gap semiconductor device has: a drift layer 12 using wide gap semiconductor material being a first conductivity type; a plurality of well regions 20 being a second conductivity type and formed in the drift layer 12; a polysilicon layer 150 provided on the well regions 20 and on the drift layer 12 between the well regions 20; an interlayer insulating film 65 provided on the polysilicon layer 150; a gate pad 120 provided on the interlayer insulating film 65; and a source pad 110 electrically connected to the polysilicon layer 150.

16 Claims, 8 Drawing Sheets

(51) Int. Cl.
*H01L 29/10* (2006.01)
*H01L 29/16* (2006.01)
*H01L 29/40* (2006.01)
*H01L 29/417* (2006.01)

(52) U.S. Cl.
CPC ...... *H01L 29/402* (2013.01); *H01L 29/41741* (2013.01); *H01L 29/4916* (2013.01); *H01L 29/66068* (2013.01)

(58) Field of Classification Search
CPC ..... H01L 29/49; H01L 29/4916; H01L 29/10; H01L 29/1095; H01L 29/16; H01L 29/1602; H01L 29/165; H01L 29/66; H01L 29/66068; H01L 29/78; H01L 29/7806; H01L 29/7811
USPC .......................................................... 257/77
See application file for complete search history.

(56) References Cited

U.S. PATENT DOCUMENTS

2016/0225891 A1 8/2016 Hiyoshi et al.
2016/0276452 A1 9/2016 Konrath et al.

FOREIGN PATENT DOCUMENTS

| JP | 2015056543 A | 3/2015 |
|---|---|---|
| JP | 2016058498 A | 4/2016 |
| JP | 2016148554 A | 8/2016 |
| WO | 2012001837 A1 | 1/2012 |

OTHER PUBLICATIONS

Written Opinion of the International Searching Authority in the international application No. PCT/JP2017/040676, dated January 231000000, 2016 and English translation provided by Google Translate.
International Preliminary Report on Patentability of the International Searching Authority in the international application No. PCT/JP2017/040676, dated Apr. 18, 2019 and English translation provided by Google Translate.
Office Action for Taiwanese patent application No. 107140061 dated Jun. 12, 2019 and English translation provided by Gugle Translate.
Decision to Grant a Patent in Japanese patent application No. 2018-541226, dated Apr. 18, 2020.

* cited by examiner

WIDE-GAP SEMICONDUCTOR DEVICE

CROSS-REFERENCE TO RELATED APPLICATION

The present application is the U.S. national phase of PCT Application PCT/JP2017/040676 filed on Nov. 13, 2017, the disclosure of which is incorporated herein by reference in its entirety.

TECHNICAL FIELD

The present invention relates to a wide-gap semiconductor device having a drift layer of a first conductivity type and a well region of a second conductivity type provided in the drift layer.

BACKGROUND ART

Typically, a well region of a second conductivity type such as a p type is provided in a region below a gate pad. In a MOSFET including a wide-gap semiconductor such as SiC, a potential of the above-mentioned well region below the gate pad abnormally increases due to displacement current during a switching operation in some cases. In this regard, WO 2012/001837 A cites high sheet resistance of a well region of a second conductivity type below a gate pad as one of reasons for potential increase in the well region.

Meanwhile, JP 2015-56543 A suggests provision of a Schottky electrode formed of a metallic material in a region below a gate pad. However, in a case where a Schottky electrode formed of a metallic material is used, the manufacturing method thereof is so complicated and incurs considerably high manufacturing costs.

SUMMARY OF INVENTION

Technical Problem

The present invention provides a semiconductor device that can prevent abnormal increase of a potential in a region below a gate pad and further prevent occurrence of such inconvenience as caused by use of a Schottky electrode formed of a metallic material.

Solution to Problem

[Concept 1]

A wide gap semiconductor device may comprise:

a drift layer being a first conductivity type;

a plurality of well regions being a second conductivity type and formed in the drift layer;

a polysilicon layer provided on the well regions and on the drift layer between the well regions;

an interlayer insulating film provided on the polysilicon layer;

a gate pad provided on the interlayer insulating film; and a source pad electrically connected to the polysilicon layer.

[Concept 2]

In the wide gap semiconductor device according to concept 1, second conductivity type regions may be provided at predetermined intervals between the well regions.

[Concept 3]

In the wide gap semiconductor device according to concept 2, regions in contact with the polysilicon layer in the second conductivity type regions may be superhigh-concentration second conductivity regions.

[Concept 4]

In the wide gap semiconductor device according to any one of concepts 1 to 3, the polysilicon layer and the drift layer may be in Schottky contact.

[Concept 5]

In the wide gap semiconductor device according to any one of concepts 1 to 4, a polysilicon layer may have an undoped polysilicon layer provided on the drift layer and a doped polysilicon layer provided on the undoped polysilicon layer.

[Concept 6]

In the wide gap semiconductor device according to any one of concepts 1 to 5, a polysilicon layer may have a lightly-doped polysilicon layer provided on the drift layer, and a heavily-doped polysilicon layer, which is provided on the lightly-doped polysilicon layer and has an impurity concentration higher than the impurity concentration of the lightly-doped polysilicon layer.

[Concept 7]

In the wide gap semiconductor device according to any one of concepts 1 to 6, a field insulating film may be provided between the well region and the polysilicon layer.

[Concept 8]

In the wide gap semiconductor device according to any one of concepts 1 to 7, a superhigh-concentration second conductivity type region may be provided in the well region and at a position below a boundary along an in-plane direction between the field insulating film and the polysilicon layer.

[Concept 9]

In the wide gap semiconductor device according to any one of concepts 1 to 8, a gate electrode may foe formed of polysilicon, which constitutes the polysilicon layer.

[Concept 10]

In the wide gap semiconductor device according to any one of concepts 1 to 9, a source region may foe provided in the well region, and an well contact region, which is adjacent to the source region and is electrically connected to the source pad, in the well region may be formed of a superhigh-concentration second conductivity type region.

Advantageous Effects of Invention

In the present invention, a polysilicon layer electrically connected to a source pad is provided between well regions among the well regions and a drift layer. On the polysilicon layer, an interlayer insulating film having a gate pad mounted thereon is provided. Providing the above-mentioned polysilicon layer can prevent abnormal increase of a potential in a region below the gate pad. Further, use of not metal but polysilicon can prevent increase of manufacturing costs without making its manufacturing method difficult.

BRIEF DESCRIPTION OF DRAWINGS

FIG. 1 is a sectional view of a semiconductor device that can be used in a first embodiment of the present invention.

FIG. 2 is an enlarged sectional view of a part of FIG. 1.

DESCRIPTION OF EMBODIMENTS

First Embodiment

<<Configuration>>

In the present embodiment, description will be given using a vertical MOSFET as one example. Though it is assumed that a first conductivity type is an n type and a second conductivity type is a p type in the description of the present embodiment, the present invention is not limited to that aspect. It may be set such that a first conductivity type is a p type and a second conductivity type is an n type. Further, though the description will be given using silicon carbide as a wide-gap semiconductor in the present embodiment, the present invention is not limited to that aspect. Gallium nitride or the like may be used as a wide-gap semiconductor. In the present embodiment, a vertical direction in FIG. 1 (a direction along a width of a wide-gap semiconductor device) will be referred to as a vertical direction and a direction perpendicular to the vertical direction will be referred to as an in-plane direction.

Figure 1:
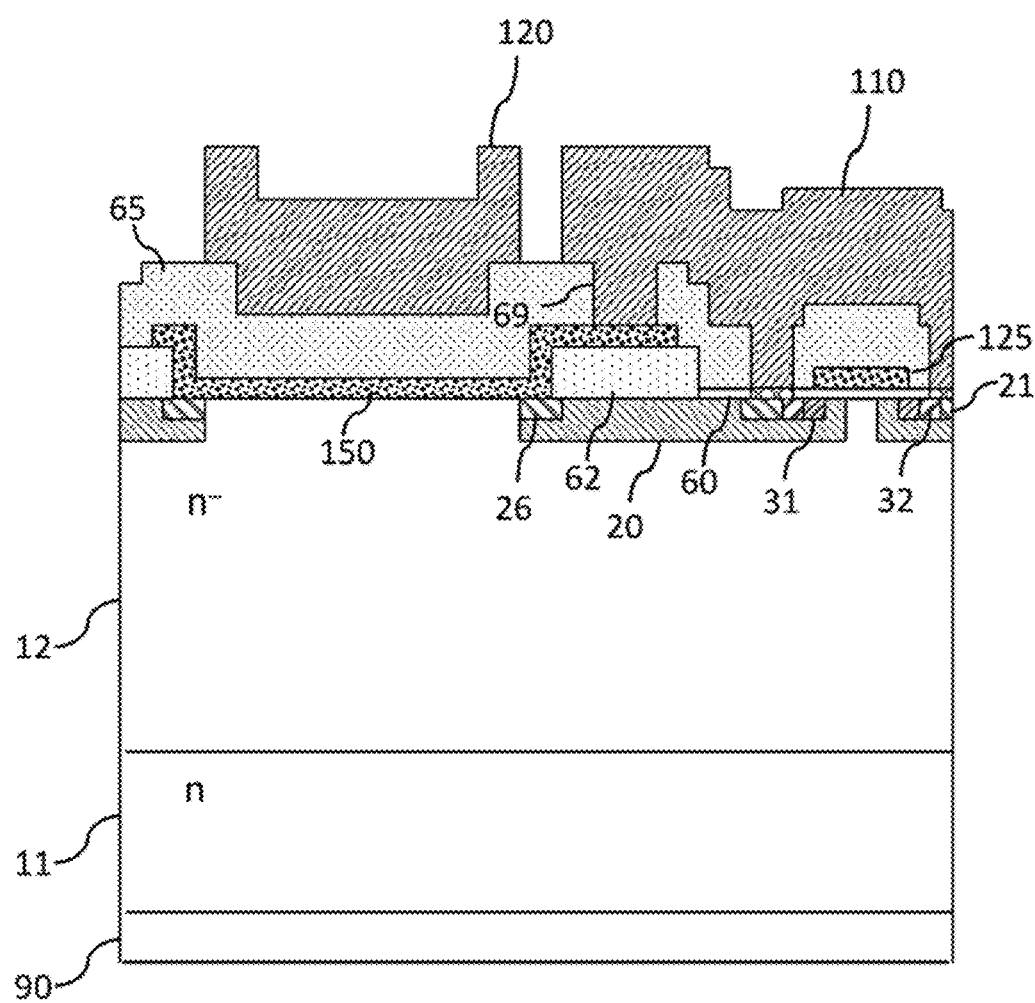

As illustrated in FIG. 1, a silicon-carbide semiconductor device according to the present embodiment may have an n-type silicon-carbide semiconductor substrate 11, a drift layer 12 that is provided on a first main surface (upper surface) of the silicon-carbide semiconductor substrate 11 and uses an n-type silicon-carbide material, a plurality of well regions 20 of a p type provided in the drift layer 12, and n-type source regions 31 and 32 provided in the well regions 20. The well regions 20 may be formed by implantation of p-type impurities into the drift layer 12, for example, and the source regions 31 and 32 may be formed by implantation of n-type impurities into the well regions 20, for example. A drain electrode 90 may be provided on a second main surface (lower surface) of the silicon-carbide semiconductor substrate 11. A voltage withstanding structure may be provided outside an outer edge of a region to be used as a cell. As the drain electrode 90, titanium, aluminum, nickel, and the like may be used, for example.

Figure 2:
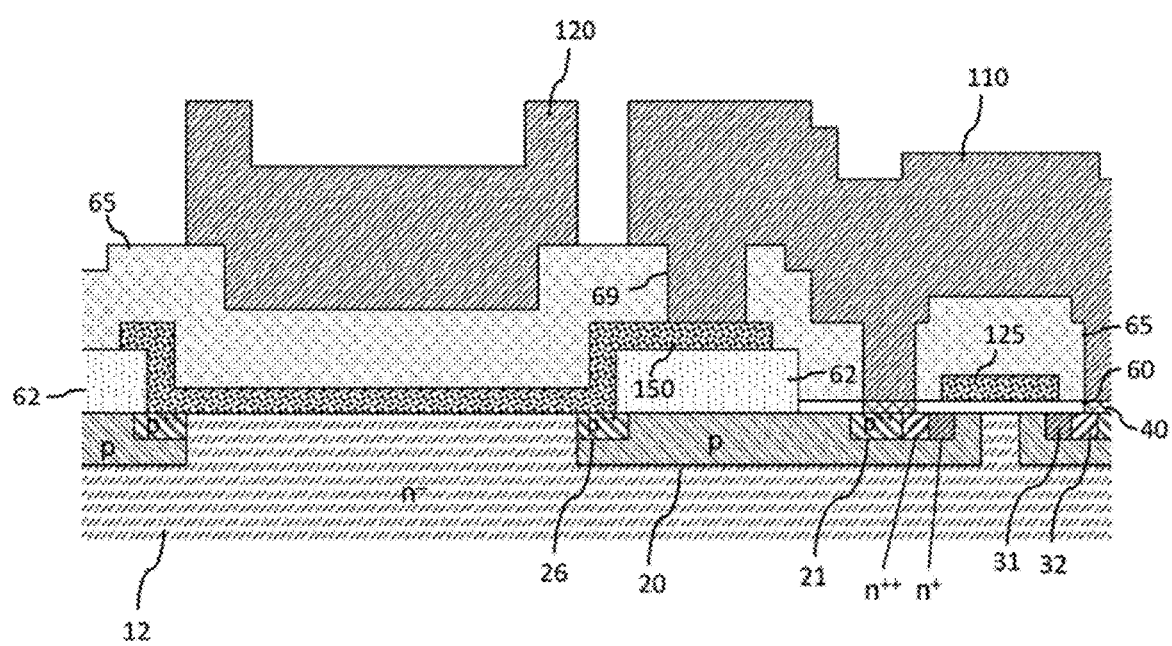

As illustrated in FIG. 2, the silicon-carbide semiconductor device may have a polysilicon layer 150 provided on the well regions 20 and the drift layer 12 between the well regions 20, an interlayer insulating film 65 provided on the polysilicon layer 150, a gate pad 120 provided on the interlayer insulating film 65, and a source pad 110 electrically connected to the polysilicon layer 150 via a contact hole 69 provided in the interlayer insulating film 65.

A gate insulating film 60 may foe provided between a part of the interlayer insulating film 65, the part being located below the source pad 110, and each of the well regions 20, the source regions 31 and 32, and the drift layer 12. A gate electrode 125 may be provided on the gate insulating film 60 between the source regions 31 and 32. The gate electrode 125 may be electrically connected to the gate pad 120.

A field insulating film 62 may be provided between the well region 20 and the polysilicon layer 150. In the well region 20, at a position below a boundary along an in-plane direction between the field insulating film 62 and the polysilicon layer 150, a superhigh-concentration p-type region ($p^{++}$) 26 may be provided. The polysilicon layer 150 may extend and lie over the field insulating film 62 to form a stepped part. Additionally, the impurity concentration of the well region 20 in the present, embodiment is $5 \times 10^{14}$ to $1 \times 10^{19}$ cm$^{-3}$, for example, and the impurity concentration of the superhigh-concentration p-type region (including a well contact region 21 described later) is $2 \times 10^{19}$ to $1 \times 10^{21}$ cm$^{-3}$, for example.

Figure 3:
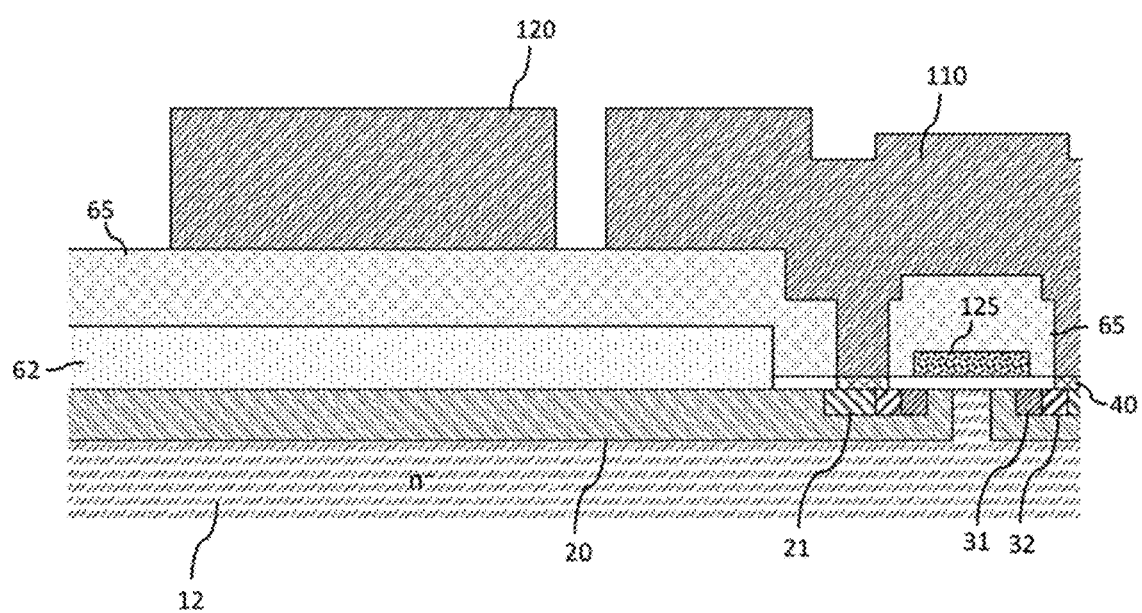
FIG. 3 is a sectional view of the semiconductor device that can be used in the first embodiment of the present invention, and is a sectional view of a part different from a part illustrated in FIG. 1.

The polysilicon layer 150 does not need to be provided in all regions below the gate pad 120. As illustrated in FIG. 3, a region where the polysilicon layer 150 is not provided may exist below the gate pad 120. In that region, the field insulating film 62 may be provided above the well region 20 and the interlayer insulating film 65 may be provided above the field insulating film 62.

The drift layer 12 may be formed on the first main surface of the silicon-carbide semiconductor substrate 11 by a CVD process or the like. The n-type impurity concentration of the drift layer 12 may be lower than the n-type impurity concentration of the silicon-carbide semiconductor substrate 11. Thus, the drift layer 12 may serve as a low-concentration region (n$^-$) and the silicon-carbide semiconductor substrate 11 may serve as a region having a higher concentration (n) than the drift layer 12. N, P, and the like can be used as n-type impurities, for example, and Al, B, and the like can be used as p-type impurities, for example. The impurity concentration of the drift layer 12 in the present embodiment is $1 \times 10^{14}$ to $4 \times 10^{18}$ cm$^{-3}$, for example, and the impurity concentration of the silicon-carbide semiconductor substrate 11 is $1 \times 10^{18}$ to $3 \times 10^{19}$ cm$^{-3}$, for example.

The gate pad 120 may be formed of metal such as Al, for example, and the gate electrode 125 may be formed of polysilicon or the like, for example. The interlayer insulating film 65 may be formed on an upper surface of the gate electrode 125 and the like. The gate electrode 125 may be formed using a CVD process, a photolithography technique, or the like, and the interlayer insulating film 65 may be formed using a CVD process or the like, and may be formed of silicon dioxide, for example.

In a case where the gate electrode 125 is formed of polysilicon, the gate electrode 125 and the polysilicon layer 150 may be formed of the same polysilicon. As polysilicon, undoped polysilicon that is doped with no impurity can be used and also doped silicon that is doped with phosphor, boron, or the like can be used. The terms "the same polysilicon" in the present embodiment mean that both of polysilicon materials are undoped polysilicon or doped polysilicon, and that the kinds and concentrations of impurities doped into doped polysilicon are the same. The terms do not require both of polysilicon materials to be simultaneously manufactured. Thus, even in a case where the gate electrode 125 is formed of polysilicon and thereafter the polysilicon layer 150 is formed separately, for example, if polysilicon materials used in the gate electrode 125 and the polysilicon layer 150 are of the same kind (undoped polysilicon or doped polysilicon) and the kinds and concentrations of impurities are the same, the gate electrode 125 and the polysilicon layer 150 are regarded as being formed of the same polysilicon.

The gate electrode 125 and the polysilicon layer 150 may be formed of different kinds of polysilicon. For example, the gate electrode 125 may be formed of doped polysilicon and the polysilicon layer 150 may be formed of undoped polysilicon. Further, even in a case where both of the gate electrode 125 and the polysilicon layer 150 are formed of doped polysilicon, n-type doped polysilicon may be used in the gate electrode 125 while p-type doped polysilicon may be used in the polysilicon layer 150. Conversely, p-type doped polysilicon may be used in the gate electrode 125 while n-type doped polysilicon may be used in the polysilicon layer 150. Moreover, even in a case where the conductivity types of impurities used in the gate electrode 125 and the polysilicon layer 150 are the same, that is, an n type or a p type, the concentrations ox the impurities may be different. The impurity concentration of doped polysilicon used in the gate electrode 125 may be higher than the impurity concentration of doped polysilicon used in the polysilicon layer 150. Conversely, the impurity concentration of doped polysilicon used in the gate electrode 125 may be lower than the impurity concentration of doped polysilicon used in the polysilicon layer 150.

As illustrated in FIG. 3, in a section where the polysilicon layer 150 is not provided, the field insulating film 62 may be provided on the well region 20, the interlayer insulating film 65 may be provided on the field insulating film 62, and the gate pad 120 may be provided on the interlayer insulating film 65. Alternatively, the polysilicon layer 150 may be provided in all regions below the gate pad 120 and the field insulating film 62 may be absent, unlike those in the above-described aspect.

As illustrated in FIG. 2, in the well region 20, a region (hereinafter also referred to as a "well contact region 21") that is adjacent to the source region 31 and 32 and is electrically connected to a source pad 110 may be formed of a superhigh-concentration p-type region ($p^{++}$). The source regions 31 and 32 may have a high-concentration n-type region ($n^+$) 31 placed on a side closer to the gate electrode 125, and a superhigh-concentration n-type region ($n^{++}$) 32 provided adjacently to the high-concentration n-type region ($n^+$). Then, the well contact region 21 may be provided adjacently to the superhigh-concentration n-type region ($n^{++}$) 32. A metallic layer 40 formed of nickel, titanium, or alloy containing nickel or titanium may be provided between each of the superhigh-concentration n-type region ($n^{++}$) 32 in the source regions 31 and 32 and the well contact region 21, and the source pad 110. Additionally, in the present embodiment, the impurity concentration of the high-concentration n-type region ($n^+$) is $1\times10^{18}$ to $2\times10^{19}$ cm$^{-3}$, for example, and the impurity concentration of the superhigh-concentration n-type region ($n^{++}$) is $2\times10^{19}$ to $1\times10^{21}$ cm$^{-3}$, for example. Further, the high-concentration n-type region ($n^+$) 31 may be absent and the corresponding region may be substituted by the superhigh-concentration n-type region ($n^{++}$) 32.

Regarding the depth of the well region 20, a bottom surface thereof is positioned at a level higher than a bottom surface of the drift layer 12, and the well region 20 may be provided in the drift layer 12. Further, regarding the depths of the source regions 31 and 32, bottom surfaces thereof are positioned at a level higher than the bottom surface of the well region 20, and the source regions 31 and 32 may be formed in the well region 20. Moreover, regarding the depth of the well contact region 21, a bottom surface thereof may be positioned at a level higher than a bottom surface of the well region 20 except the well contact region 21.

The polysilicon layer 150 and the drift layer 12 provided between the well regions 20 illustrated in FIG. 2 may be in Schottky contact. Meanwhile, the superhigh-concentration n-type region ($n^{++}$) 32 in the source regions 31 and 32 may be in ohmic contact with the metallic layer 40 provided below the source pad 110. Further, also the well contact region 21 that is a superhigh-concentration p-type region ($p^{++}$) may be in ohmic contact with the metallic layer 40 provided below the source pad 110.

<<Operations and Effects>>

Next, examples of operation and effect of the present embodiment having the above-described configuration will be described. Note that ail aspects described in "Operation and Effects" can be adopted in the above-described configuration.

In the present embodiment, in a case of adopting an aspect in which the polysilicon layer 150 electrically connected to the source pad 110 is provided between the well regions 20 among the well regions 20 and the drift layer 12, the interlayer insulating film 65 is provided on the polysilicon layer 150, and the gate pad 120 is provided on the interlayer insulating film 65 as illustrated in FIG. 2, abnormal increase of a potential in a region below the gate pad 120 can be prevented.

In a case where the p-type well region 20 is provided in all regions below the source pad 110, the sheet resistance is 1 kΩ/□ or higher. In contrast thereto, in a case where doped polysilicon is used as the polysilicon layer 150, the sheet resistance can be reduced to approximately a little over 10Ω/□, which can suppress potential increase in the well region 20.

Further, as compared to contact resistance to a region containing p-type impurities in a case where the same metal is in contact with both of a region containing n-type impurities and the region containing p-type impurities in silicon carbide, contact resistance between doped polysilicon and metal is much lower. Thus, also in this respect, potential increase in the well region 20 can be suppressed.

Further, if a Schottky electrode formed of a metallic material is used below an interlayer insulating film below a gate pad, the manufacturing process thereof is considerably complicated and manufacturing costs therefor are considerably high. In contrast thereto, providing the polysilicon layer 150 below an interlayer insulating film below a gate pad is advantageous in that the manufacturing process thereof is simplified.

In a case where the gate electrode 125 is formed of polysilicon and the gate electrode 125 and the polysilicon layer 150 are formed of the same polysilicon, the polysilicon layer 150 can be formed simultaneously with formation of the gate electrode 125. This can significantly simplify the manufacturing process thereof. Specifically, the polysilicon layer 150 can be formed at the time of film formation for the gate electrode 125 formed of polysilicon in a cell part including the source regions 31 and 32. This is significantly advantageous in that a manufacturing process similar to an already-existing manufacturing process can be employed.

The interlayer insulating film 65 may be formed after formation of the gate electrode 125 and the polysilicon layer 150. Then, when a gate contact hole for connecting the gate pad 120 and the gate electrode 125 is formed in the formed interlayer insulating film 65, a contact hole 69 also may be formed in a part of the interlayer insulating film 65, the part being located above the polysilicon layer 150. Thereafter, the gate pad 120 and the source pad 110 may be formed, the gate pad 120 and the gate electrode 125 may be electrically connected via the gate contact hole, and the source pad 110 and the polysilicon layer 150 may be electrically connected via the contact hole 69.

Additionally, in view of frequent use of doped polysilicon as the gate electrode 125, using doped polysilicon as the polysilicon layer 150 is advantageous.

Second Embodiment

Next, a second embodiment of the present invention will be described.

Figure 4:
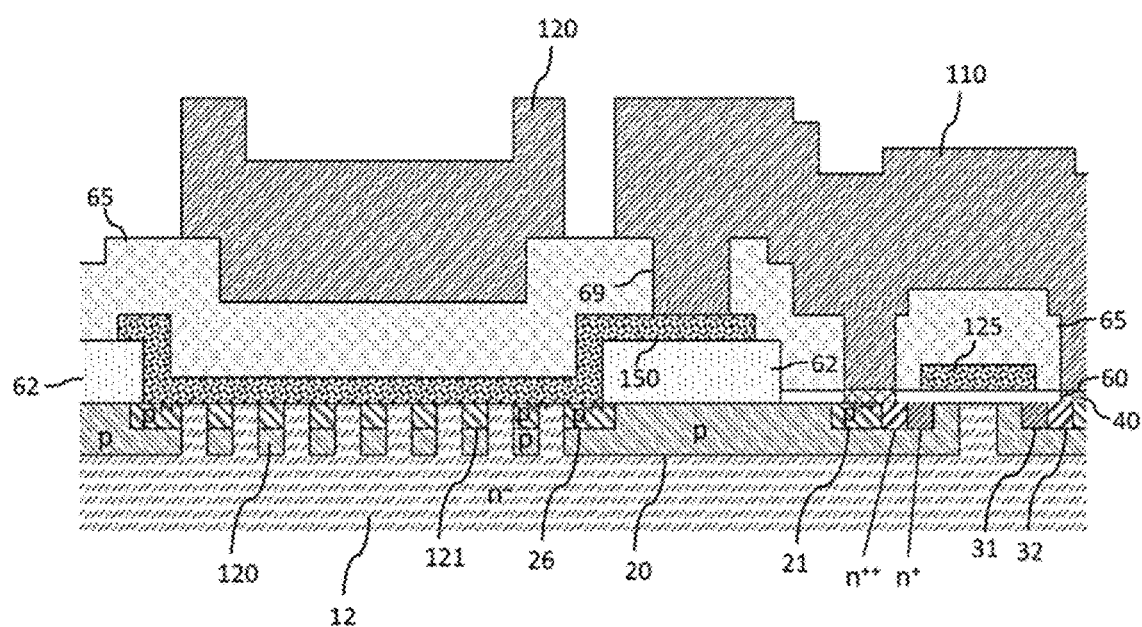
FIG. 4 is a sectional view of a semiconductor device that can be used in a second embodiment of the present invention.

In the present embodiment, as illustrated in FIG. 4, p-type regions 120 and 121 that are regions of a second conductivity type are provided at predetermined intervals in a drift layer 12 between well regions 20. In the present embodiment, in the p-type regions 120 and 121, a region in contact with a polysilicon layer 150 may be formed of the superhigh-concentration p-type region ($p^{++}$) 120. In the other respects, this embodiment is similar to the first embodiment and various configurations employed in the first embodiment can be employed also in the second embodiment. The members described in the first embodiment will be described with the same reference signs.

In the present embodiment, the polysilicon layer 150 and the drift layer 12 may be in Schottky contact and the polysilicon layer 150 and the superhigh-concentration p-type region 121 in the p-type regions 120 and 121 may be in ohmic contact. Adopting this aspect, allows employment of a JBS structure.

In a case where doped polysilicon, or n-type doped polysilicon in particular, is used as the polysilicon layer 150, a Schottky barrier $\varphi B$ is reduced excessively in some cases. In this regard, employing a JBS structure can compensate such reduction of a Schottky barrier $\varphi B$. Particularly, by reducing a pitch in a JBS structure, in other words, by reducing an interval along an in-plane direction between the p-type regions 120 or 121 (setting the interval to approximately 1 to 10 μm, for example), it is possible to more surely compensate reduction of a Schottky barrier $\varphi B$.

In a case where such a JBS structure as in the present, embodiment is used, it can be considered to employ the following manufacturing method, for example.

The p-type regions 120 and 121 having the high-concentration p-type region 120 and the superhigh-concentration p-type region 121 are formed by implantation of p-type impurity ions or the like, thereby forming a JBS structure. Subsequently, processes are performed to form a film of polysilicon. Then, in the film of polysilicon, a part that is to form the gate electrode 125 is left and a part where the polysilicon layer 150 is to be provided is removed, to form a field opening.

Thereafter, the polysilicon layer 150 is formed on an upper surface of the JBS structure. On a gate electrode 125, polysilicon forming the polysilicon layer 150 may be further stacked thereon. In order not to leave the stacked polysilicon, the polysilicon layer 150 may be formed on the gate electrode 125 after the gate electrode 125 is beforehand covered with a mask of an oxide film, for example, and then the mask may be removed after patterning.

Then, an interlayer insulating film 65 is formed. When a gate contact hole is formed in the formed interlayer insulating film 65, a contact hole 65 also is formed in a part of the interlayer insulating film 65, the part being located above the polysilicon layer 150.

Thereafter, a gate pad 120 and a source pad 110 are formed, the gate pad 120 and the gate electrode 125 are electrically connected via the gate contact hole, and the source pad 110 and the polysilicon layer 150 are electrically connected via the contact hole 69.

Third Embodiment

Next, a third embodiment of the present invention will be described.

Figure 5:
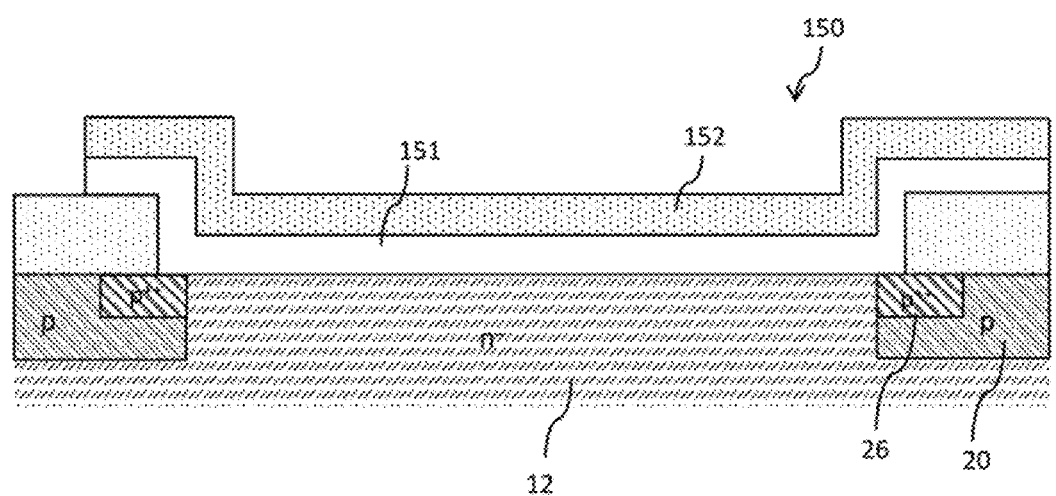
FIG. 5 is a sectional view of a semiconductor device that can be used in a third embodiment of the present invention.

In the present embodiment, as illustrated in FIG. 5, a polysilicon layer 150 has an undoped polysilicon layer 151 in contact with a drift layer 12, and a doped polysilicon layer 152 provided on the undoped polysilicon layer 151. Various configurations employed in the above-described embodiments can be employed also in the third embodiment. The members described in the above embodiments will be described with the same reference signs.

As described above, in a case where doped polysilicon is used as the polysilicon layer 150, particularly in a case where n-type doped polysilicon is used, a Schottky barrier $\varphi B$ is reduced excessively in some cases. In this regard, in the present embodiment, providing the undoped polysilicon layer 151 as a layer in contact with the drift layer 12 can prevent excessive reduction of a Schottky barrier $\varphi B$.

Figure 6:
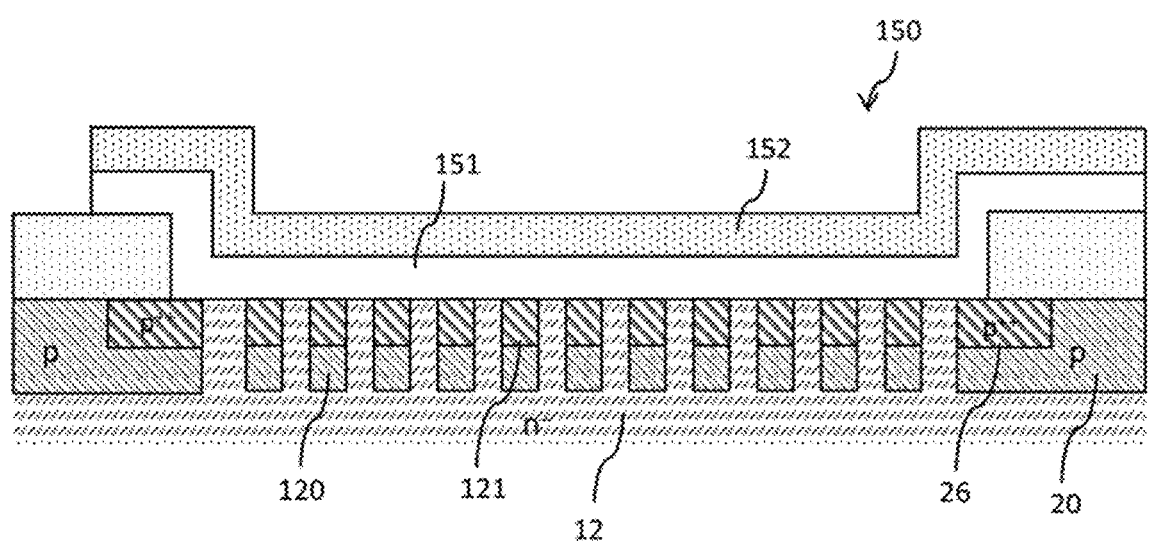
FIG. 6 is a sectional view of a semiconductor device that can be used in a modification of the third embodiment of the present invention.

As described above, in the present embodiment, the aspects in the above-described embodiments can be adopted. Thus, as illustrated in FIG. 6, such a JBS structure as in the second embodiment can be employed. More specifically, the polysilicon layer 150 and the drift layer 12 may be in Schottky contact and the polysilicon layer 150 and a superhigh-concentration p-type region 121 in p-type regions 120 and 121 may be in ohmic contact, thereby forming a JBS structure. Adopting this aspect can more surely prevent excessive reduction of a Schottky barrier $\varphi B$. Further, as described in the second embodiment, also in a case of adopting an aspect in which an interval between superhigh-concentration p-type regions is reduced, excessive reduction of a Schottky barrier $\varphi B$ can be prevented.

In a case where such a JBS structure as described in the second embodiment is employed in the present embodiment, it can be considered to employ the following manufacturing method, for example.

The p-type regions 120 and 121 having the high-concentration p-type region 120 and the superhigh-concentration p-type region 121 are formed by implantation of p-type impurity ions or the like, thereby forming a JBS structure. Subsequently, processes are performed to form a film of polysilicon. Then, in the film of polysilicon, a part that is to form a gate electrode 125 is left and a part where the polysilicon layer 150 is to be provided is removed, to form a field opening.

Thereafter, the undoped polysilicon layer 151 is formed. Then, the doped polysilicon layer 152 is formed on the undoped polysilicon layer 151. At that time, on the gate electrode 125, while the undoped polysilicon layer 151 and the doped polysilicon layer 152 that form the polysilicon layer 150 may be formed sequentially, a part of the undoped polysilicon layer 151, the part having been formed on the gate electrode 125, may be removed by etching or the like to reduce influences of the undoped polysilicon layer 151. Alternatively, in the gate electrode 125, only a region in contact with the gate pad 120 may be processed so that the undoped polysilicon layer 151 is not formed there. For example, in the gate electrode 125, the undoped polysilicon layer 151 may be removed only in a region in contact with the gate pad 120.

Moreover, an undoped polysilicon layer having a thickness equal to a total thickness of the undoped polysilicon layer 151 and the doped polysilicon layer 152 may be formed. Then, only a part corresponding to the doped polysilicon layer 152 may be doped by ion implantation, for example.

Fourth Embodiment

Next, a fourth embodiment of the present invention will be described.

Figure 7:
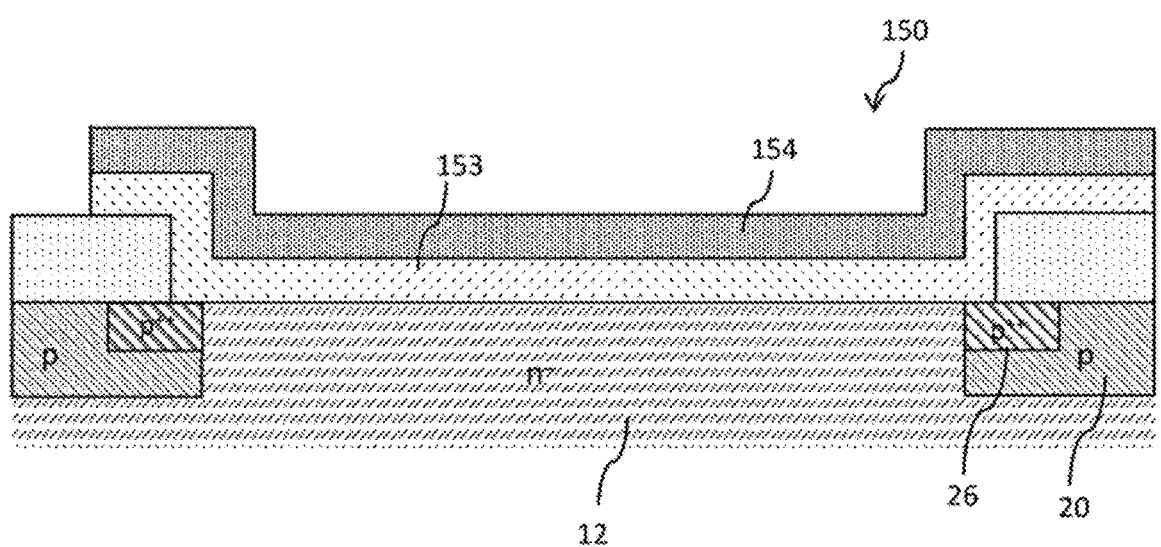
FIG. 7 is a sectional view of a semiconductor device that can be used in a fourth embodiment of the present invention.

In the present embodiment, as illustrated in FIG. 7, a polysilicon layer 150 has a lightly-doped polysilicon layer 153 in contact with a drift layer 12, and a heavily-doped polysilicon layer 154 that is provided on the lightly-doped polysilicon layer 153 and has an impurity concentration higher than the impurity concentration of the lightly-doped polysilicon layer 153. Various configurations employed in the above-described embodiments can be employed also in the fourth embodiment. The members described in the above embodiments will be described with the same reference signs. Additionally, the impurity concentration of the lightly-doped polysilicon layer 153 is $1 \times 10^{15}$ to $5 \times 10^{18}$ cm$^{-3}$, for example, and the impurity concentration of the heavily-doped polysilicon layer 154 is $5 \times 10^{18}$ to $1 \times 10^{21}$ cm$^{-3}$, for example.

Also this embodiment can produce effects similar to those produced by the third embodiment. That is, providing the lightly-doped polysilicon layer 153 as a layer in contact with the drift layer 12 can prevent excessive reduction of a Schottky barrier φB.

Figure 8:
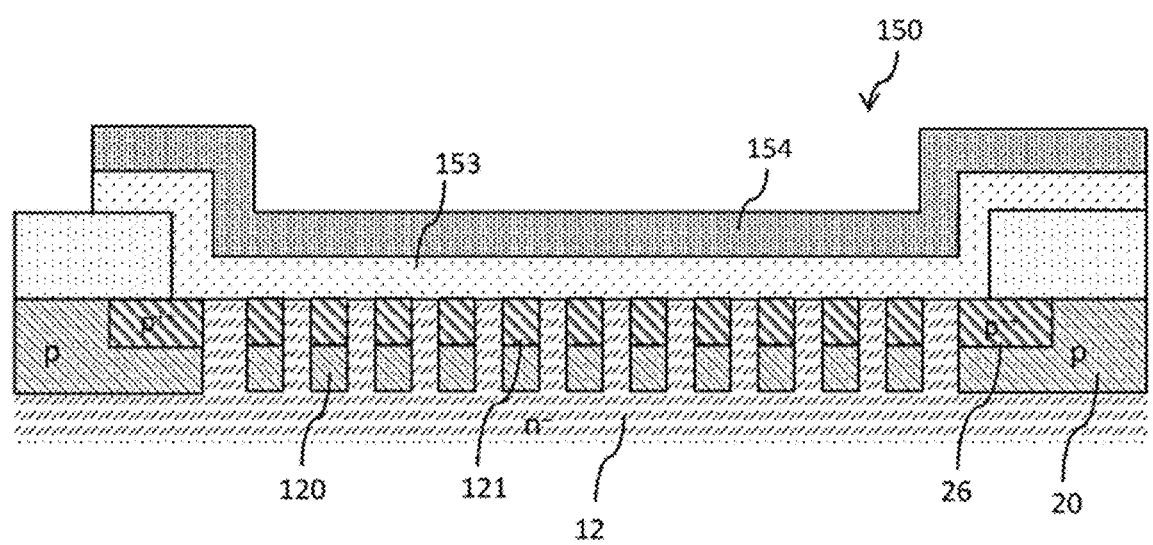
FIG. 8 is a sectional view of a semiconductor device that can be used in a modification of the fourth embodiment of the present invention.

As described above, in the present embodiment, the aspects in the above-described embodiments can be adopted. Thus, as illustrated in FIG. 8, such a JBS structure as in the second embodiment can be employed. More specifically, the polysilicon layer 150 and the drift layer 12 may be in Schottky contact and the polysilicon layer 150 and a superhigh-concentration p-type region 121 in p-type regions 120 and 121 may be in ohmic contact, thereby forming a JBS structure. Adopting this aspect can more surely prevent excessive reduction of a Schottky barrier φB. Further, also in a case of not adopting the aspect in which an interval between the p-type regions 120 or 121 is reduced as described in the second embodiment, excessive reduction of a Schottky barrier φB can be prevented.

The description of each embodiment, the description of the modification, and the disclosure of the drawings described above are merely examples for explaining the invention described in the claims, and the invention described in the claims is not limited by the description of the embodiment or the disclosure of the drawings described above. In addition, the recitation of the claims at the original application is merely an example, and the description of the claims can be appropriately changed based on the description of the specification, the drawings, and the like.

REFERENCE SIGNS LIST 12 drift layer
20 well region
21 well contact region
26 superhigh-concentration p-type region (superhigh-concentration region of a second conductivity type)
62 field insulating film
65 interlayer insulating film
110 source pad
120 gate pad
150 polysilicon layer
151 undoped polysilicon layer
152 doped polysilicon layer
153 lightly-doped polysilicon layer
154 heavily-doped polysilicon layer

The invention claimed is:

1. A wide gap semiconductor device comprising:
a drift layer being a first conductivity type;
a plurality of well regions being a second conductivity type and formed in the drift layer;
a polysilicon layer provided on the well regions and on the drift layer between the well regions;
an interlayer insulating film provided on the polysilicon layer;
a gate pad provided on the interlayer insulating film; and
a source pad electrically connected to the polysilicon layer,
wherein a polysilicon layer has an undoped polysilicon layer provided on the drift layer and a doped polysilicon layer provided on the undoped polysilicon layer.

2. The wide gap semiconductor device according to claim 1, wherein
second conductivity type regions are provided at predetermined intervals between the well regions.

3. The wide gap semiconductor device according to claim 2, wherein
regions in contact with the polysilicon layer in the second conductivity type regions are superhigh-concentration second conductivity regions.

4. The wide gap semiconductor device according to claim 1, wherein
the polysilicon layer and the drift layer are in Schottky contact.

5. A wide gap semiconductor device comprising:
a drift layer being a first conductivity type;
a plurality of well regions being a second conductivity type and formed in the drift layer;
a polysilicon layer provided on the well regions and on the drift layer between the well regions;
an interlayer insulating film provided on the polysilicon layer;
a gate pad provided on the interlayer insulating film; and
a source pad electrically connected to the polysilicon layer,
wherein a polysilicon layer has a lightly-doped polysilicon layer provided on the drift layer, and a heavily-doped polysilicon layer, which is provided on the lightly-doped polysilicon layer and has an impurity concentration higher than the impurity concentration of the lightly-doped polysilicon layer.

6. The wide gap semiconductor device according to claim 1, wherein
a field insulating film is provided between the well region and the polysilicon layer.

7. The wide gap semiconductor device according to claim 6, wherein
a superhigh-concentration second conductivity type region is provided in the well region and at a position below a boundary along an in-plane direction between the field insulating film and the polysilicon layer.

8. The wide gap semiconductor device according to claim 1, wherein
a gate electrode is formed of polysilicon, which constitutes the polysilicon layer.

9. The wide gap semiconductor device according to claim 1, wherein
a source region is provided in the well region, and
an well contact region, which is adjacent to the source region and is electrically connected to the source pad, in the well region is formed of a superhigh-concentration second conductivity type region.

10. The wide gap semiconductor device according to claim 5, wherein
second conductivity type regions are provided at predetermined intervals between the well regions.

11. The wide gap semiconductor device according to claim 10, wherein
regions in contact with the polysilicon layer in the second conductivity type regions are superhigh-concentration second conductivity regions.

12. The wide gap semiconductor device according to claim 5, wherein
the polysilicon layer and the drift layer are in Schottky contact.

13. The wide gap semiconductor device according to claim 5, wherein
a field insulating film is provided between the well region and the polysilicon layer.

14. The wide gap semiconductor device according to claim 13, wherein
a superhigh-concentration second conductivity type region is provided in the well region and at a position below a boundary along an in-plane direction between the field insulating film and the polysilicon layer.

15. The wide gap semiconductor device according to claim 5, wherein
a gate electrode is formed of polysilicon, which constitutes the polysilicon layer.

16. The wide gap semiconductor device according to claim 5, wherein
a source region is provided in the well region, and
an well contact region, which is adjacent to the source region and is electrically connected to the source pad, in the well region is formed of a superhigh-concentration second conductivity type region.

* * * * *